United States Patent
Reynolds

(10) Patent No.: US 6,181,628 B1
(45) Date of Patent: Jan. 30, 2001

(54) POWER-ON-RESET CIRCUIT WITH ANALOG DELAY AND HIGH NOISE IMMUNITY

(75) Inventor: Grahame K. Reynolds, Lordswood (GB)

(73) Assignee: Cypress Semiconductor Corp., San Jose, CA (US)

(*) Notice: Under 35 U.S.C. 154(b), the term of this patent shall be extended for 0 days.

(21) Appl. No.: 09/339,602

(22) Filed: Jun. 24, 1999

Related U.S. Application Data
(60) Provisional application No. 60/091,115, filed on Jun. 29, 1998.

(51) Int. Cl.[7] .................................................. G11C 7/00
(52) U.S. Cl. ............................ 365/226; 365/194; 365/196
(58) Field of Search ..................................... 365/194, 229, 365/227, 226, 196, 191

(56) References Cited

U.S. PATENT DOCUMENTS

| | | | |
|---|---|---|---|
| 4,254,347 | 3/1981 | Ray ........................... | 307/297 |
| 4,634,905 | 1/1987 | Campbell, Jr. ............. | 307/594 |
| 4,875,195 | 10/1989 | Momodomi et al. ........ | 365/230.08 |
| 4,888,498 | 12/1989 | Kadakia ..................... | 307/296.4 |
| 5,144,159 | 9/1992 | Frisch et al. ............... | 307/272.3 |
| 5,212,412 | 5/1993 | Atriss et al. ................ | 307/296.4 |
| 5,241,494 | 8/1993 | Blyth et al. ................. | 365/45 |
| 5,302,861 | 4/1994 | Jelinek ....................... | 307/296.5 |
| 5,323,066 | 6/1994 | Feddeler et al. ............ | 307/272.3 |
| 5,396,115 | 3/1995 | Coffman et al. ............ | 327/143 |
| 5,432,328 | 7/1995 | Yamaguchi .................. | 235/449 |
| 5,446,403 | 8/1995 | Witkowski ................... | 327/143 |
| 5,477,176 | 12/1995 | Chang et al. ............... | 327/143 |
| 5,483,187 | 1/1996 | Jang ........................... | 327/143 |
| 5,523,709 | 6/1996 | Phillips et al. .............. | 327/143 |
| 5,530,397 | 6/1996 | Nakai et al. ................ | 327/545 |
| 5,532,577 | 7/1996 | Doluca ........................ | 323/282 |
| 5,535,752 | * 7/1996 | Halperin et al. ............ | 128/670 |
| 5,557,579 | 9/1996 | Raad et al. ................. | 365/226 |
| 5,587,866 | 12/1996 | Yach et al. ................. | 361/90 |
| 5,602,502 | 2/1997 | Jiang .......................... | 327/143 |
| 5,649,098 | 7/1997 | Shieh et al. ................ | 395/185.08 |
| 5,677,619 | 10/1997 | Doluca ........................ | 323/282 |
| 5,703,510 | 12/1997 | Iketani et al. .............. | 327/143 |
| 5,710,741 | 1/1998 | McLaury ..................... | 365/226 |
| 5,721,502 | 2/1998 | Thomson et al. ........... | 327/143 |
| 5,764,714 | * 6/1998 | Stansell et al. ............. | 375/377 |
| 5,822,387 | * 10/1998 | Mar ............................ | 375/376 |
| 5,917,255 | * 6/1999 | Ciccone ...................... | 307/130 |

* cited by examiner

*Primary Examiner*—David Nelms
*Assistant Examiner*—Thong Le
(74) *Attorney, Agent, or Firm*—Christopher P. Maiorana, P.C.

(57) ABSTRACT

A power-on-reset circuit that may be configured to present a power-on-reset signal in response to a voltage. The power-on-reset circuit may comprise a voltage detector, a first analog delay circuit and a feedback loop. The first analog delay circuit may be coupled to an output of the voltage detector. The feedback loop may be coupled an output of the power-on-reset circuit to an input of the power-on-reset circuit.

13 Claims, 1 Drawing Sheet

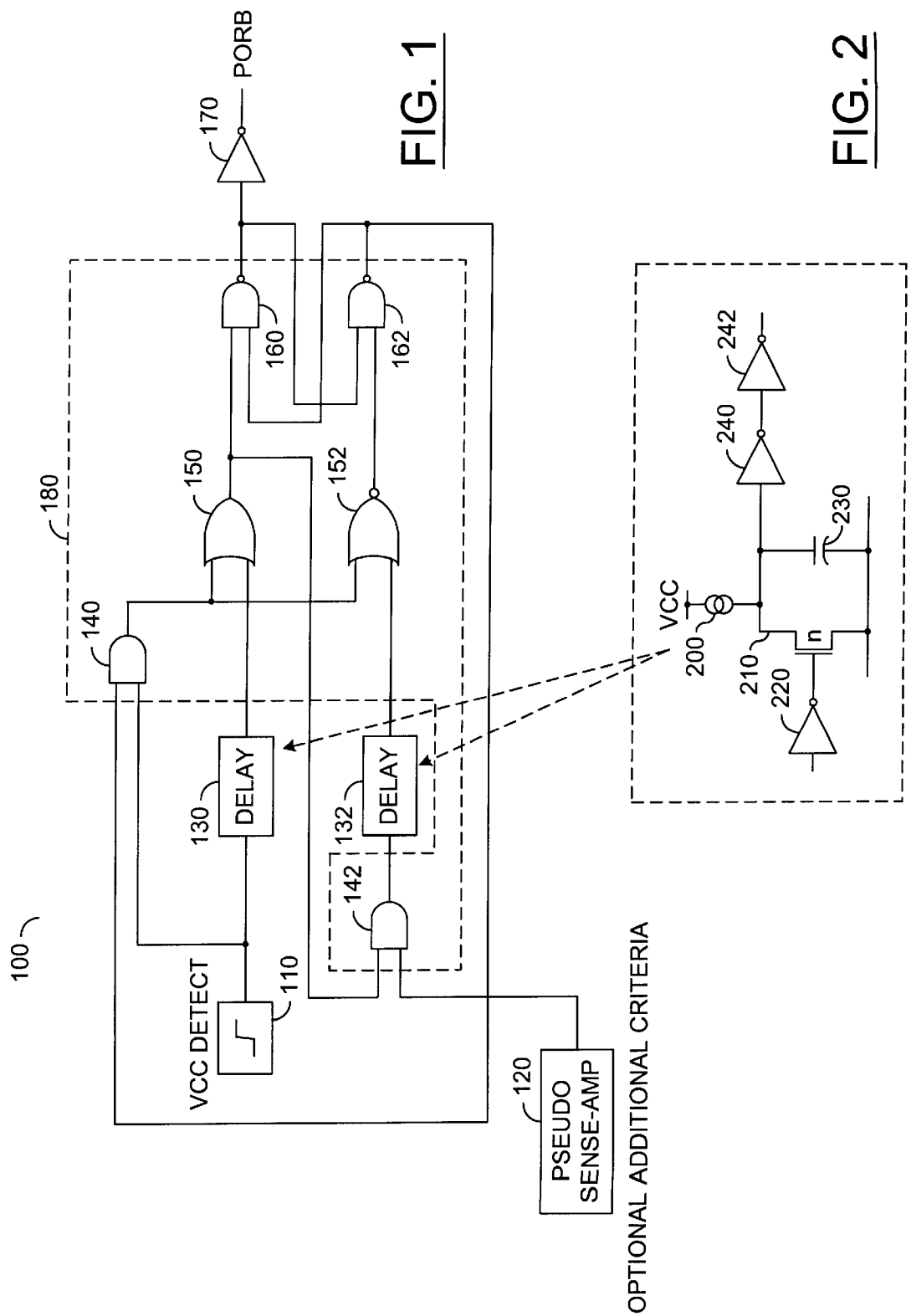

POWER-ON-RESET CIRCUIT WITH ANALOG DELAY AND HIGH NOISE IMMUNITY

This application claims the benefit of U.S. Provisional Application Ser. No. 60/091,115, filed Jun. 29, 1998, which is hereby incorporated by reference in its entirety.

FIELD OF THE INVENTION

The present invention relates to reset circuits generally and, more particularly, to a power-on-reset circuit with analog delay and high noise immunity.

BACKGROUND OF THE INVENTION

Many POR circuits have a supply detector that effectively decides whether the POR signal is asserted. This detector will assert a control signal at power up of the device. This detector may also assert the control signal if the supply voltage undergoes a major transition such as a glitch. The responsibility for the POR signal is thus in the domain of the detector, and the detector is designed to switch under adverse (but defined) conditions.

In order to add a delay (or "timeout") to the POR circuit to extend the duration of the POR signal, one should ensure that the delay circuit does not override the detector. The delay circuit should therefore be more noise immune/tolerant than the detector. Otherwise, the POR signal may be asserted under inappropriate conditions.

In U.S. Pat. No. 5,477,176 (to Chang et al.), the delay circuit has little or no supply noise immunity. Furthermore, it does not appear to be possible to reset the delay circuit in response to a supply glitch (reset condition). This may be a consequence of the lack of feedback circuitry in the POR circuit. The POR circuit of Chang et al. appears to be highly susceptible to supply noise, whereby the delay circuit may cause a full and unwanted transition in the POR output. The detector is thus not dominant, and the delay circuit will not be reset when the detector fires. Once the capacitor is charged, a transition on the detector output does not enforce a discharge.

In U.S. Pat. No. 5,602,502 (to Jiang), it also does not appear to be possible to reset the delay circuit in response to a supply glitch (reset condition). This may also be a consequence of the lack of feedback circuitry in the POR circuit of Jiang. However, Jiang's circuit has some delay circuit noise immunity since the delay circuit is latched off when the POR is complete. The delay capacitor element is not reset, however, hence a full duration POR signal may not be effected. In systems such as that of Jiang, the duration of the POR signal typically depends on the rate at which the capacitor discharges, since it is not actively discharged.

In U.S. Pat. No. 5,302,861 (to Jelinek), the POR circuit contains neither a delay circuit nor a feedback element. This circuit has two capacitors, which appear to be used for decoupling, rather than for a delay.

U.S. Pat. No. 5,557,579 (to Raad et al.) discloses a delay circuit, which appears to have little or no supply noise immunity or feedback. Functionally, Raad et al. describe a POR circuit. Two such circuits are actually described since within the text of this patent. A reference is made to an alternative circuit where the detector controls the delay circuit. However, the delay circuit appears to offer little or no noise immunity, and therefore, may be susceptible to unwanted resetting. This is exacerbated by the fact that the POR state is not latched. The POR circuit of Raad et al. is targeted at a DRAM application where the POR indicates when the memory element state is valid. However, there is no feedback from the memory element to indicate when it is valid. The delay must be carefully chosen to meet or exceed the time required for that device or that size of memory.

SUMMARY OF THE INVENTION

The present invention concerns a power-on-reset circuit that may be configured to present a power-on-reset signal in response to a voltage. The power-on-reset circuit may comprise a voltage detector, a first analog delay circuit and a feedback loop. The first analog delay circuit may be coupled to an output of the voltage detector. The feedback loop may be coupled an output of the power-on-reset circuit to an input of the power-on-reset circuit.

The purpose of this invention is to provide a power-on-reset circuit that incorporates an analog delay element yet retains relatively high noise immunity.

Another purpose of this invention is to provide a power-on-reset circuit in which the noise immunity is dominated by an operating voltage detector.

These and other purposes, objects and advantages of the invention, which will become apparent from reading the following detailed description of the invention, will be discussed in greater detail in the following sections.

Conventionally, power-on-reset circuits should exhibit high noise immunity to supply disturbance. Introducing analog delay element(s) into such circuits is detrimental to that noise immunity.

Within the power-on-reset (POR) circuit, a detector may be present to distinguish circumstances and/or conditions where resetting the circuitry affected and/or controlled by the POR circuit is appropriate. Other elements within the POR circuit should continue to be functional in these circumstances, thus suggesting that the detector remain dominant.

BRIEF DESCRIPTION OF THE DRAWINGS

These and other objects, features and advantages of the present invention will be apparent from the following detailed description and the appended claims and drawings in which:

FIG. 1 is a detailed drawing of the preferred embodiment; and

FIG. 2 is a detailed description of the analog delay element.

DETAILED DESCRIPTION OF THE PREFERRED EMBODIMENT

The primary differentiator of the present POR circuit lies in the control function(s) of the detector (e.g., "Vcc Detect" in FIG. 1). During power up, and also once the POR cycle has completed (after power up), the detector dominates the remaining POR circuitry, and the delay circuit can never interfere. In other words, as long as the detector fails to detect an operable supply voltage, an active power-on-reset signal will be asserted. Similarly, as long as the delay circuitry is charging up (as well as any logic circuitry receiving the output thereof), an active power-on-reset signal will be asserted. The noise immunity of the detector is thus dominant and the design of the circuit is unique in this respect.

An added advantage of the present POR circuit is that the detector controls the delay circuit. If the detector asserts an active signal, the delay cycle may be initiated for the full duration of the delay since the detector resets the delay circuit. In many prior POR circuits, a supply glitch may cause the POR circuit to assert an active signal, but the delay circuit does not get reset and is thus only effective at initial power up.

An even further advantage of the present POR circuit is provided by confirmation (feedback) from the chip circuitry to indicate that the power is up (i.e., the supply voltage has reached a level at which chip circuitry may function) and the internal circuitry has settled (i.e., completed a functional, demonstrative operation to assure chip operability).

The critical condition for correct operation of a chip, integrated circuit or device having the present POR circuit thereon is when the voltage a node mimicking the internal node having the highest capacitance on the chip meets or exceeds a predetermined threshold (e.g., is established at, for example, 2.2V). In one embodiment, the node may represent a signal that goes to every cell in a circuit comprising a plurality of cells, and is thus a highly capacitive node that takes a long time to settle. For example, the internal node may be one coupled to all memory (e.g., EEPROM) cells in a logic block or on a programmable logic device. Once this signal has settled, the cells will then operate correctly and output valid data. The present POR circuit monitors the state of the line mimicking the internal node and holds the POR signal until the output signal (i.e., "PORB" in FIG. 1) is valid. This differentiator results from the feedback from the POR circuit output (e.g., output logic gate(s), such as the NAND gates in FIG. 1), and optionally, the circuitry that is to be reset (e.g., "Optional additional criteria" in FIG. 1, which may be a sense amplifier, a pseudo-sense amplifier, an operational amplifier, a reference voltage generator, a memory cell, an array of memory cells, a latch or register, a series of latches or registers such as a shift register, etc.).

The present POR circuit can equally be used outside of the integrated circuit, chip or device that it controls. The circuit monitoring the mimic node or the internal node can simply be removed or replaced with another feedback condition. The present POR circuit may thus have an inherent link to the worst case memory cell and the delay may adjust automatically to whatever memory size is present.

FIG. 1 shows an exemplary schematic of the present POR circuit 100, comprising a voltage detector 110 (e.g., "Vcc detect," which may be conventional), an inverter 170, an analog delay element 130 that receives the output of the voltage detector 110, analog delay element 132 that receives a feedback loop and an optional Pseudo Sense-Amp 120 that may be configured to present a signal to the analog delay element 132. The present POR circuit 100 may further comprise conventional logic circuit 180 configured to activate a power-on-reset signal (e.g., "PORB") when the supply voltage is below a predetermined threshold, when a capacitive node in the delay circuitry has a voltage below a predetermined threshold, and optionally, when an internal node on the chip, integrated circuit or device has a voltage below a predetermined threshold (to be discussed in later detail). The conventional logic circuit 180 may comprise, in one example, an AND gate 140, an AND gate 142, an OR gate 150, a NOR gate 152, a NAND gate 160 and a NAND gate 162. However, other appropriate logic gates may be implemented accordingly to meet the design criteria of a particular implementation.

Preferably, logic circuit 180 in the present POR circuit 100 activates the power-on-reset signal PORB in response to inputs from the voltage detector 110, the feedback loop, and optionally, the internal node. Once the supply voltage, the capacitive node voltage, and optionally, the internal node voltage meet or exceed their respective predetermined thresholds, the power-on-reset signal PORB is deactivated and the remaining circuitry on the chip may be operated in accordance with known procedures and/or under known conditions.

FIG. 2 shows an exemplary schematic of an analog delay circuit 130 and 132 for the present POR circuit 100. The inverters 220, 240 and 242 are optional, but they may assure relatively stable input and output signals to and from the analog circuitry. The important elements are (a) a conventional constant current source 200, coupled between a first operating voltage (e.g., Vcc) and the capacitive node 210, and (b) a capacitor 230 coupled between the capacitive node 210 and a second operating voltage complementary to the first operating voltage (e.g., Vss or ground).

The capacitance of the capacitor 230 may be selected such that it approximates the capacitance of the internal node having the largest capacitance on the chip.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:

(i) a voltage detector configured to receive a voltage;

(ii) a first analog delay circuit coupled to an output of said voltage detector;

(iii) a logic circuit configured to present a power-on-reset signal in response to one or more of said output from said voltage detector, an output from said first analog delay and said power-on-reset signal;

(iv) a second analog delay circuit configured to provide said power-on-reset signal in response to said output of said logic circuit, and (v) a sense amplifier configured to present a control signal to said second delay circuit, wherein said second delay circuit generates said power-on-reset signal in further response to said control signal.

2. The circuit according to claim 1, wherein said first analog delay circuit comprises:

a constant current source coupled between said voltage and a capacitive node; and a capacitor coupled between said capacitive node and ground.

3. The circuit according to claim 1, wherein said second analog delay circuit comprises:

a constant current source coupled between said voltage and a capacitive node; and a capacitor coupled between said capacitive node and ground.

4. The circuit according to claim 2, wherein said first analog delay circuit further comprises at least one inverter.

5. The circuit according to claim 3, wherein said second analog delay circuit further at least one inverter.

6. A power-on-reset circuit configured to present a power-on-reset signal in response to a voltage, comprising:

(i) a voltage detector;

(ii) a first analog delay circuit coupled to an output of said voltage detector;

(iii) a logic circuit receiving outputs from said voltage detector and said first analog delay circuit, wherein said logic circuit is configured to provide an active power-on-reset signal in response to one or more of a supply voltage for an integrated circuit controlled by said power-on-reset circuit, a capacitive voltage of said analog delay circuit, and said power-on-reset signal; and a sense amplifier configured to present a sense signal to said logic circuit, wherein said logic circuit is configured to present said active power-on-reset signal in further response to said sense signal.

7. The power-on-reset circuit of claim 6, further comprising a second analog delay circuit configured to provide a second analog output, wherein said logic circuit is configured to generate said active power-on-reset signal in further response to said second analog output.

8. The power-on-reset circuit according to claim 6, wherein said first and second analog delay circuits comprise:

a constant current source coupled between said voltage and a capacitive node; and a capacitor coupled between said capacitive node and a complementary voltage complementary to said voltage.

9. The power-on-reset circuit according to claim 8, wherein said first and second analog delay circuits each further comprise at least one inverter.

10. The power-on-reset circuit according to claim 6, wherein said logic circuit is configured to present said active power-on-reset signal when (i) said supply voltage for said integrated circuit controlled by said power-on-reset circuit is below a first predetermined threshold, and (ii) a capacitive node in the first analog delay circuit has said capacitive voltage below a second predetermined threshold.

11. The power-on-reset circuit according to claim 10, wherein said logic circuit is further configured to provide said active power-on-reset signal in response to an internal node voltage for said integrated circuit being below a third predetermined threshold.

12. The power-on-reset circuit according to claim 4, wherein said logic circuit is further configured to deactivate said active power-on-reset signal in response to said supply voltage meeting or exceeding said first predetermined threshold, and said capacitive voltage meeting or exceeding said second predetermined threshold.

13. The power-on-reset circuit according to claim 12, wherein said logic circuit is further configured to deactivate said active power-on-reset signal in response to said internal node voltage meeting or exceeding a third predetermined threshold.

* * * * *